US009171733B2

(12) United States Patent
Ruzic et al.

(10) Patent No.: US 9,171,733 B2
(45) Date of Patent: Oct. 27, 2015

(54) METHOD OF SELECTIVELY ETCHING A THREE-DIMENSIONAL STRUCTURE

(75) Inventors: David N. Ruzic, Pesotum, IL (US); John R. Sporre, Albany, NY (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/981,501

(22) PCT Filed: Jan. 24, 2012

(86) PCT No.: PCT/US2012/022303
§ 371 (c)(1),
(2), (4) Date: Jul. 24, 2013

(87) PCT Pub. No.: WO2012/103054
PCT Pub. Date: Aug. 2, 2012

(65) Prior Publication Data
US 2013/0309873 A1    Nov. 21, 2013

Related U.S. Application Data

(60) Provisional application No. 61/436,039, filed on Jan. 25, 2011.

(51) Int. Cl.
*H01L 29/66* (2006.01)
*G01B 11/00* (2006.01)
*C03C 15/00* (2006.01)
*H01L 21/3065* (2006.01)

(52) U.S. Cl.
CPC ...... *H01L 21/3065* (2013.01); *H01L 29/66818* (2013.01)

(58) Field of Classification Search
USPC ............................................. 216/65
See application file for complete search history.

(56) References Cited

U.S. PATENT DOCUMENTS

| 5,310,989 A | 5/1994 | Russell et al. |
|---|---|---|
| 5,795,493 A | 8/1998 | Bukhman et al. |
| 7,297,892 B2 | 11/2007 | Kelley et al. |
| 2001/0041392 A1 | 11/2001 | Suzawa et al. |
| 2005/0106789 A1* | 5/2005 | Gottsche et al. ............... 438/163 |
| 2008/0248628 A1 | 10/2008 | Son et al. |
| 2008/0277745 A1 | 11/2008 | Hsu et al. |
| 2010/0203732 A1 | 8/2010 | Doris et al. |

FOREIGN PATENT DOCUMENTS

WO    WO 2007/142610    12/2007
WO    WO 2008091242 A2 *  7/2008

OTHER PUBLICATIONS

Holber et al. "Laser enhanced plasma etching of silicon" Appl. Phys. Lett 46, 1985, p. 201-203.*

(Continued)

*Primary Examiner* — Allan Olsen
*Assistant Examiner* — Margaret D Klunk
(74) *Attorney, Agent, or Firm* — Brinks Gilson & Lione

(57) ABSTRACT

A method of selectively etching a three-dimensional (3-D) structure includes generating a plasma in contact with the 3-D structure, and illuminating a designated portion of the 3-D structure with a laser beam while the plasma is being generated. Nonilluminated portions of the 3-D structure are etched at a first etch rate, and the designated portion of the 3-D structure is etched at a second etch rate, where the second etch rate is different from the first etch rate.

19 Claims, 16 Drawing Sheets

(56) References Cited

OTHER PUBLICATIONS

Holber, William Martin, "Laser-Assisted Plasma Etching." Ph.D. Thesis, Columbia University, 1987. Source: Dissertation Abstracts International, vol. 48-01, Section: B, p. 0176.

International Search Report for International PCT Application No. PCT/US2012/022303, mailing date May 10, 2012, pp. 1-2.

Hisamoto, Digh et al., "Metallized Ultra-Shallow-Junction Device Technology for Sub-0.1 µm Gate MOSFET's", *IEEE Transactions on Electronic Devices*, 41, 5 (May 1994) pp. 745-750.

Huang, Xuejue et al., "Sub 50-nm FinFET: PMOS", *International Electron Devices Meeting, IEDM '99 Technical Digest* (1999) pp. 67-70.

Singh, N. et al., "High-Performance Fully Depleted Silicon Nanowire (Diameter ≤ 5 nm) Gate-All-Around CMOS Devices", *IEEE Electron Device Letters*, 27, 5 (May 2006) pp. 383-386.

Wong, Hon-Sum Philip et al., Self-Aligned (Top and Bottom) Double-Gate MOSFET with a 25 nm Thick Silicon Channel, *International Electron Devices Meeting, IEDM '97 Technical Digest* (1997) pp. 427-430.

\* cited by examiner

Result III (1064nm)
Investigation of 1064 nm laser DEAL
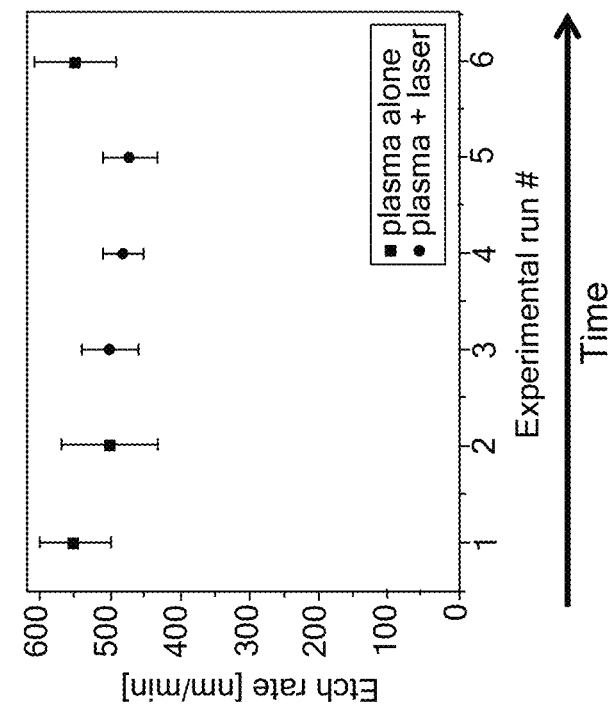
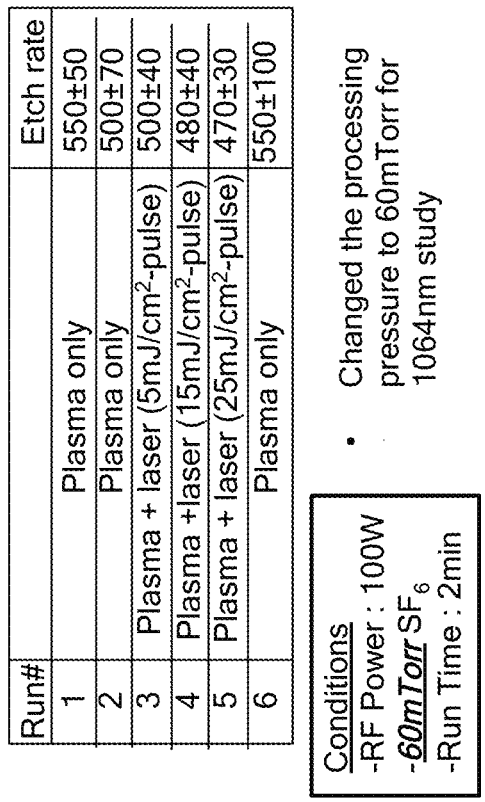
| Run# | | Etch rate |
|---|---|---|
| 1 | Plasma only | 550±50 |
| 2 | Plasma only | 500±70 |
| 3 | Plasma + laser (5mJ/cm²-pulse) | 500±40 |
| 4 | Plasma +laser (15mJ/cm²-pulse) | 480±40 |
| 5 | Plasma + laser (25mJ/cm²-pulse) | 470±30 |
| 6 | Plasma only | 550±100 |
- Changed the processing pressure to 60mTorr for 1064nm study
Conditions
- RF Power : 100W
- 60mTorr $SF_6$
- Run Time : 2min
FIG. 14

Surface Coverage Time $$\bar{v} = \sqrt{\frac{8kt}{\pi M}} = 5.76 \times 10^4 \ cm/s$$

$$T_{ads} = \frac{1}{4} s n_F \bar{v} = 1.44 \times 10^{15} \ / \ cm^2 \cdot s$$

$$\tau = \frac{n_0'}{T_{ads}}$$

- For 20mTorr $SF_6$, $n_{SF6}$=6.6x$10^{14}$/$cm^3$
- For a laboratory ICP plasma at 100 W rf, good guess plasma density ($n_e$) is ~$10^{11}$/$cm^3$
- Assume the sticking coefficient s for F radical is 0.1-1
- $n_F$ in $SF_6$ plasma is in the order of $10^{13}$/$cm^3$ referring to literature, *Russian Microelectronics, Vol. 30, No. 2, 2001, pp. 69-87.*

| s·$n_F$ | T |
|---|---|
| $10^{10}$/$cm^3$ | 0.69 s |
| $10^{11}$/$cm^3$ | 69 ms |
| $10^{12}$/$cm^3$ | 6.9 ms |
| $10^{13}$/$cm^3$ | 0.69 ms |

- So, it takes about 1 - 10 ms to cover the surface with F radicals.

FIG. 15

METHOD OF SELECTIVELY ETCHING A THREE-DIMENSIONAL STRUCTURE

RELATED APPLICATIONS

The present patent document is the national stage of International Application No. PCT/US2012/022303, which was filed on Jan. 24, 2012 and which claims the benefit of the filing date under 35 U.S.C. §119(e) of Provisional U.S. Patent Application Ser. No. 61/436,039, filed Jan. 25, 2011. Both patent applications are hereby incorporated by reference in their entirety.

TECHNICAL FIELD

The present disclosure is related generally to microfabrication technologies and more particularly to laser-assisted plasma etching.

BACKGROUND

Planar transistors have been the core of integrated circuits for several decades, during which the size of the individual transistors has steadily decreased. At the current pace of scaling, the industry predicts that planar transistors will reach feasible limits of miniaturization in the near future, concurrent with the widespread adoption of 32 nm technologies. At such sizes, planar transistors are expected to suffer from, undesirable short channel effects, especially "off-state" leakage current, which increases the idle power required by the device.

As microelectronic devices become smaller and smaller, three-dimensional structures are coming into the mainstream in forming semiconductor junctions. Multigate transistors are one of several strategies being developed by CMOS semiconductor manufacturers to create ever-smaller microprocessors and memory cells and extend Moore's Law. Development efforts into multigate transistors have been reported by AMD, Hitachi, IBM, Infineon, Intel, TSMC, Freescale, UC Berkeley and others and the ITRS predicts that such devices will be the cornerstone of sub-32 nm technologies.

In a multigate device, the channel is surrounded by several gates on multiple surfaces, allowing more effective suppression of "off-state" leakage current. Multiple gates also allow enhanced current in the "on" state, also known as drive current. These advantages translate to lower power consumption and enhanced device performance. Nonplanar devices are also more compact than conventional planar transistors, enabling higher transistor density which translates to smaller overall microelectronics. The primary challenges to integrating nonplanar multigate devices into conventional semiconductor manufacturing processes include fabrication of a thin silicon "fin" tens of nanometers wide and fabrication of matched gates on multiple sides of the fin.

The term fin-field effect transistor (FinFET) was coined by University of California, Berkeley researchers to describe such a structure. Referring now to FIG. 1, the distinguishing characteristic of the FinFET is that the conducting channel is wrapped around a thin silicon "fin," which forms the body of the device. The dimensions of the fin determine the effective channel length of the device.

The term FinFET is also employed by various microprocessor manufacturers to describe their double-gate development efforts. In the technical literature, FinFET is used somewhat generically to describe any fin-based, multigate transistor architecture regardless of number of gates. Dozens of multi-gate transistor variants may be found in the literature. In general, these variants may be differentiated and classified in terms of architecture (planar vs. non-planar design) and number of channels/gates (two, three, or four). Planar double-gate transistors generally employ conventional planar (layer-by-layer) manufacturing processes to create double-gate devices, avoiding more stringent lithography requirements associated with non-planar, vertical transistor structures. In planar double-gate transistors the channel is sandwiched between two independently fabricated gate/gate oxide stacks; a significant challenge in fabricating such structures is achieving satisfactory self-alignment between the upper and lower gates. In the technical literature, the term tri-gate is sometimes used generically to denote any multi gate FET with three effective gates or channels. Gate-all-around FETs are similar in concept to FinFETs except that the gate material surrounds the channel region on all sides. Depending on design, gate-all-around FETs can have two or four effective gates.

It has become very difficult to create such three-dimensional structures with standard etching techniques, and almost impossible to figure out how to make them even smaller. The formation of 3-D device architectures such as the FinFET is thus fraught with challenges. To form a thinner channel body structure with a wide body in the channel extension region in a FinFET MOSFET device, complex processing methods are generally employed, such as hard mask trimming after e-beam or optical lithography, spacer patterning, which is using a sacrificial and spacer layers that are formed by chemical vapor deposition (CVD), and a phase-shift mask method using a deep ultra-violet lithography at 193 nm.

If one could directly etch such structures along a given direction while not affecting the other surfaces, smaller and more advanced features could be made. This, in turn, could enable the production of smaller, faster, and cheaper computer chips and all of the consumer electronics products in which they are found.

BRIEF SUMMARY

An improved method of selectively etching a three-dimensional structure has been developed.

The method comprises generating a plasma in contact with a three-dimensional structure and illuminating a designated portion of the three-dimensional structure with a laser beam while the plasma is being generated. Nonilluminated portions of the three-dimensional structure are plasma etched at a first etch rate, and the designated portion of the three-dimensional structure is plasma etched at a second etch rate, where the second etch rate is different from the first etch rate.

BRIEF DESCRIPTION OF THE DRAWINGS

FIG. 14 shows etch rate results for a 1064 nm laser wavelength;

FIG. 15 provides estimates of the time required to cover a specimen surface with F radicals from an $SF_6$ plasma;

DETAILED DESCRIPTION

Figure 1:
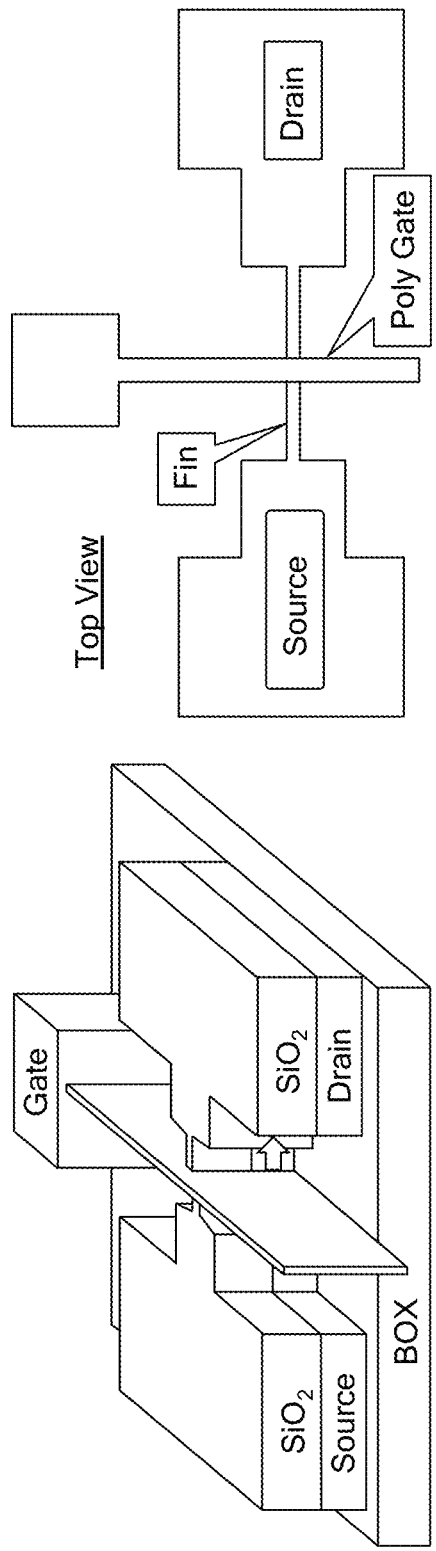
FIG. 1 shows perspective and top view schematics of a FinFET device, courtesy of Prof. Cheming Hu, Tsu-Jae King-Liu and Jeffrey Bokor.
Figure 2:
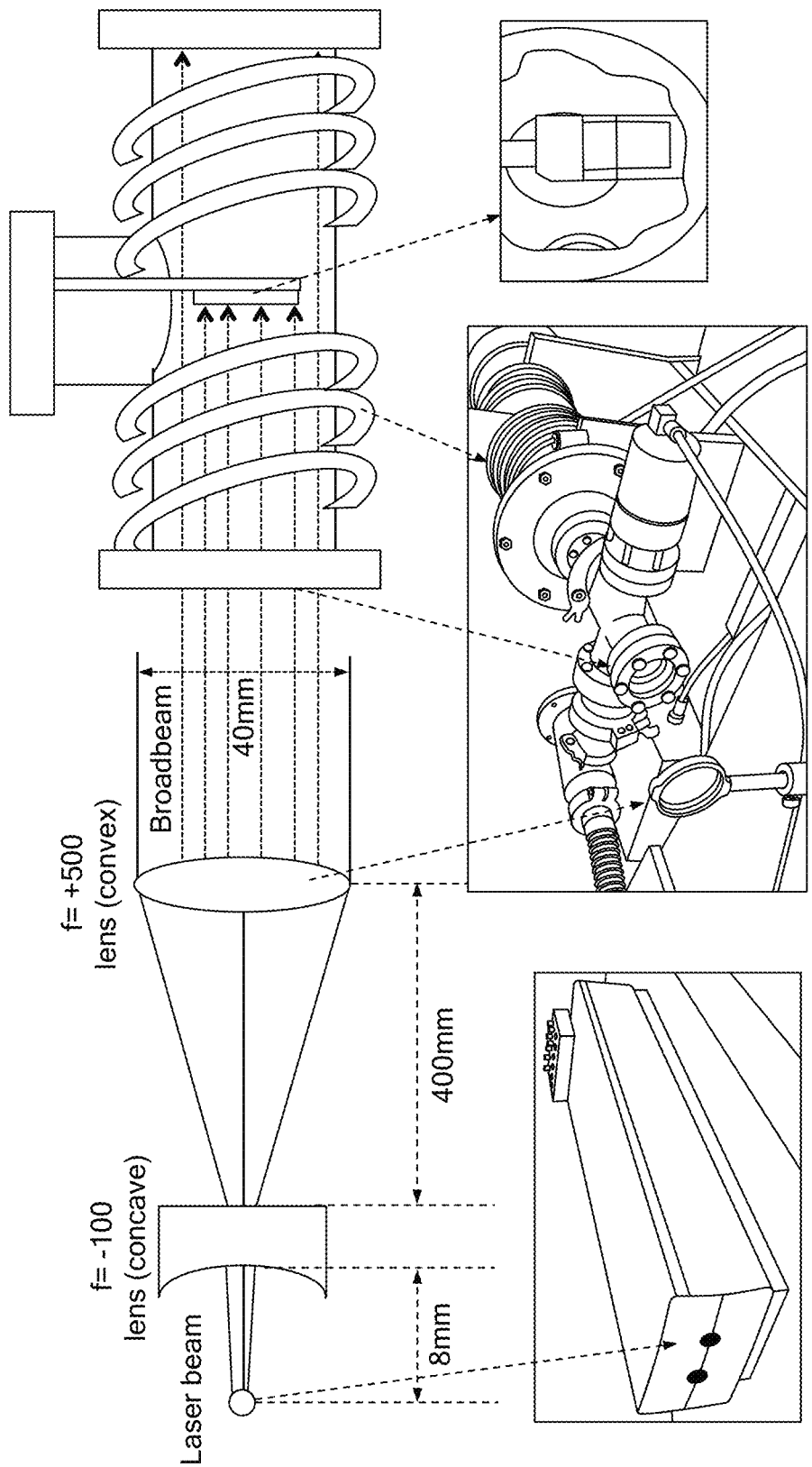
FIG. 2 is a schematic of an exemplary apparatus for direct etching assisted by laser (DEAL)

Direct etching assisted by laser (DEAL) allows a three-dimensional structure to be etched along a specific direction or vector by defocusing or scanning a laser beam during plasma etching. The three-dimensional structure that undergoes etching may be made of any of a variety of materials, including semiconductor materials such as Si or $SiO_2$. As described below, portions of the three-dimensional (3-D) structure may be selectively illuminated by the laser beam, and the plasma etch rate of different portions of the 3-D structure may thus be controlled. A schematic of an exemplary DEAL system, which includes a laser beam, a series of lenses, and a plasma chamber is shown in FIG. 2.

The method of selective etching includes generating a plasma in contact with a 3-D structure, and illuminating a designated portion of the 3-D structure with a laser beam while the plasma is being generated. Nonilluminated portions of the 3-D structure are etched at a first etch rate, and the designated portion of the 3-D structure is etched at a second etch rate, where the second etch rate is different from the first etch rate, and may be at least about 30% lower than the first etch rate.

The second etch rate may also be at least about 50% lower than the first etch rate. Advantageously, an even higher selectivity is achieved, and the second etch rate is at least about 80% lower than the first etch rate. Illumination with the laser beam may cause active radicals to be desorbed from the designated portion of the 3-D structure before they react, thereby reducing the second etch rate.

Further details about the method and experimental results are set forth below. Prior to conducting the experiments, it was anticipated that etching would be enhanced (not reduced) in the region of the 3-D structure illuminated by the laser beam; in particular, it was expected that heat and/or the photoelectron effect would activate the material in the illuminated region and promote a reaction with the etchant gas(es). This initial hypothesis was supported by what is known in the art about factors influencing etch rates. For example, in reactive ion etching (RIE), a plasma produces radicals such as Cl or F atoms that may cause etching (e.g., by the formation of a volatile compound (such as $SiF_4$)) if they can attach to sites that have been "activated" by ion bombardment. Ions travel straight down due to the acceleration provided by the plasma sheath, often augmented by an rf-bias on the substrate, and etching occurs where the ions hit. Etching may also occur where there is no ion bombardment in RIE (e.g., sidewalls of deep trenches), but it tends to be very slow. The temperature dependence of the etching rates is exponential, however.

Thus, it was initially anticipated in DEAL that etching would occur preferentially where the laser beam hit, since a pulse of photons could induce significant local heating. A short wavelength laser employed in DEAL could have photon energies greater than the work function of the material, thus producing photoelectron emission and dangling bonds. However, the experimental data indicate that illumination by the laser beam tends to reduce, not increase, the etch rate. This surprising result may be due to the desorption of active radicals from the illuminated surface that Occurs at the proper laser energy and power density. Accordingly, a combination of the right laser energy and the right power density can dial in the desired degree of selectivity.

Figure 3:
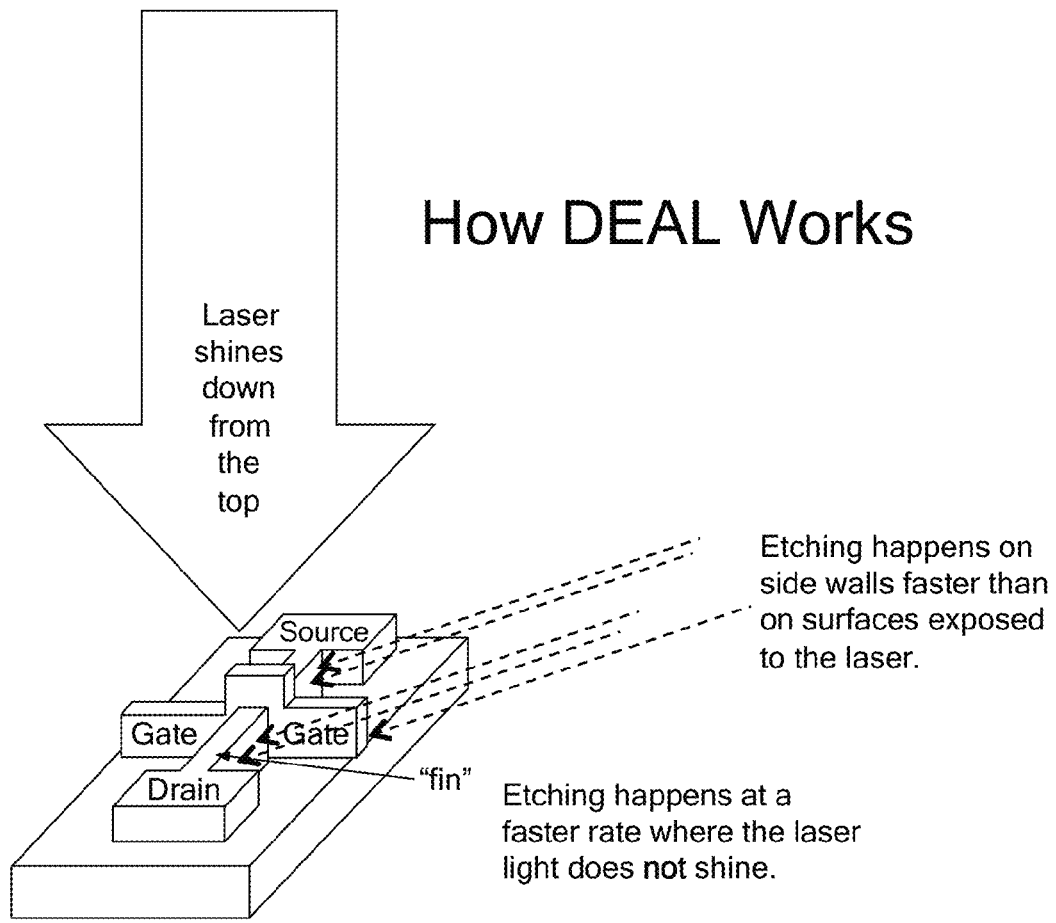
FIG. 3 is a schematic of illustrating the functioning of the DEAL process according to one embodiment.

The method may be advantageous for fabricating thin fins for multigate transistors. In such an application, plasma etching may take place only along surface edges of wafer features illuminated by a laser which is defocused or scanned while aimed nearly parallel to the wafer. This may be referred to as etching along a vector. Referring to FIG. 3, the laser illumination may act to quench the etching process. This concept was proven by initial experiments carried out at 100 W (rf power) with a pressure of 70 mTorr of $SF_6$ gas and laser wavelengths of 266 nm and 532 nm for 5 min.

Figure 4:
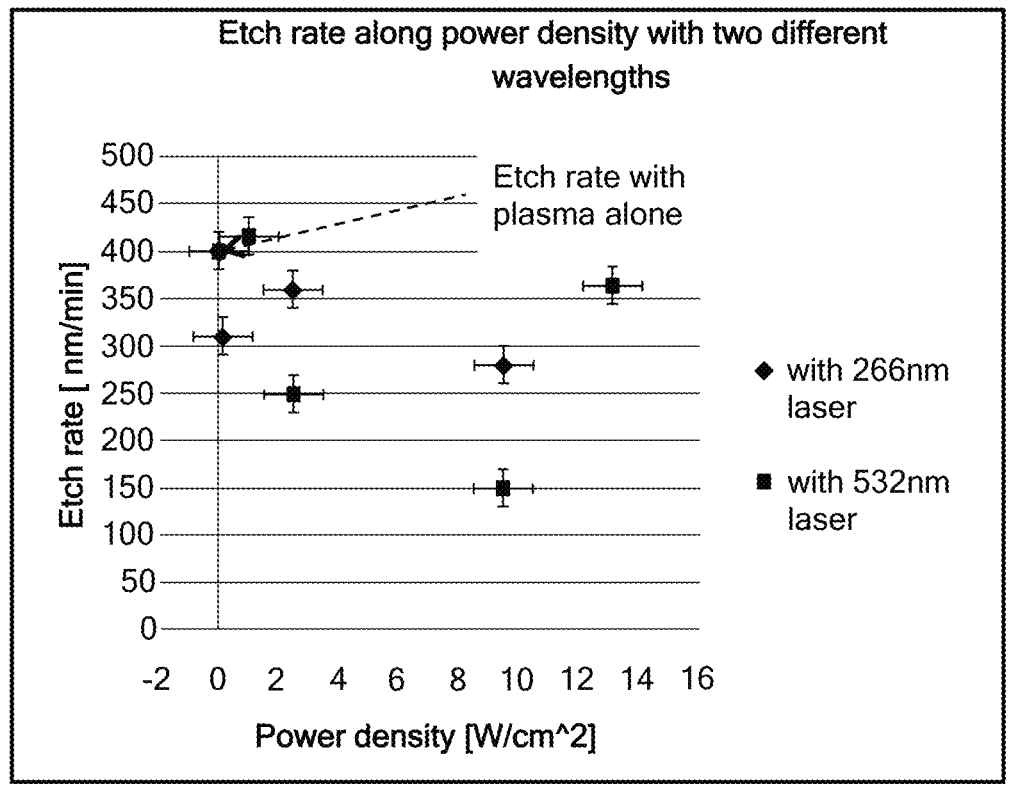
FIG. 4 shows etch rate as a function of power density for preliminary DEAL experiments.

FIG. 4 shows etch rate as a function of power density for these initial experiments. In both cases, the addition of laser exposure slows down etching, and the higher power density beams slow down etching more during the time investigated. Given the same process time and a similar power density, the 532 nm laser beam retards etching more than the 266 nm laser. The data indicate an effect, but no clear pattern.

To investigate whether F atoms were being desorbed from the sample surface simply due to a bulk temperature rise, the temperature of the sample after exposure to an $SF_6$ plasma and after exposure to an $SF_6$ plasma plus a defocused 532 nm laser beam was investigated. Temperature was measured using thermal dots on the back side of a silicon sample.

Figure 5:
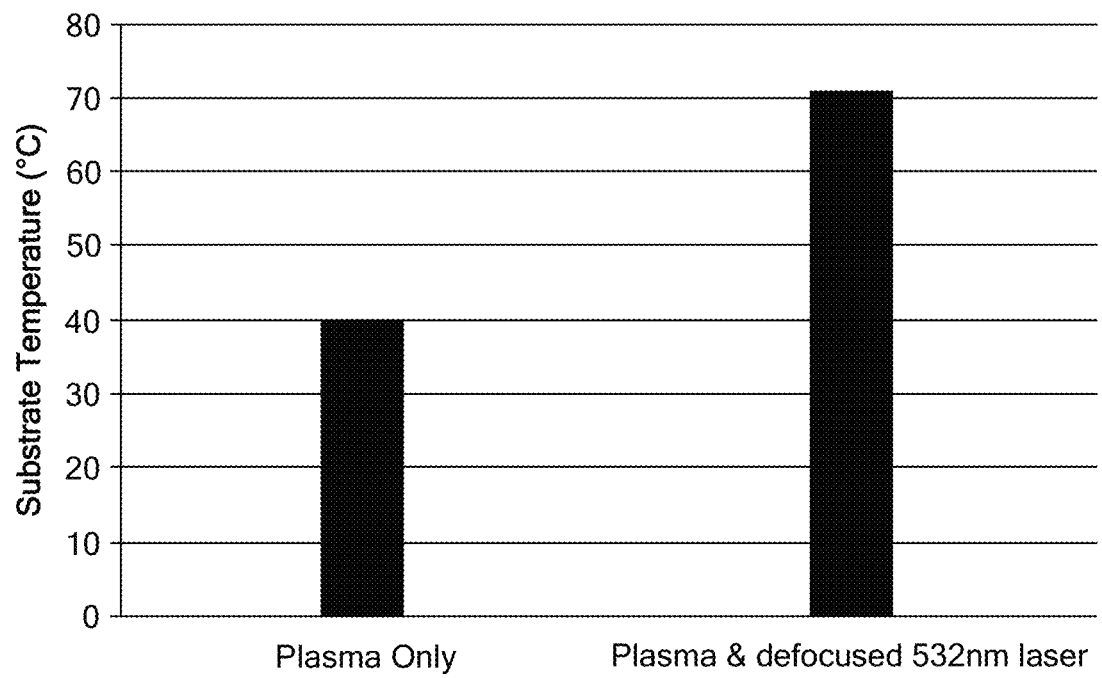
FIG. 5 shows substrate temperature after exposure to a plasma alone and a plasma plus a defocused 532 nm laser.
Figure 6:
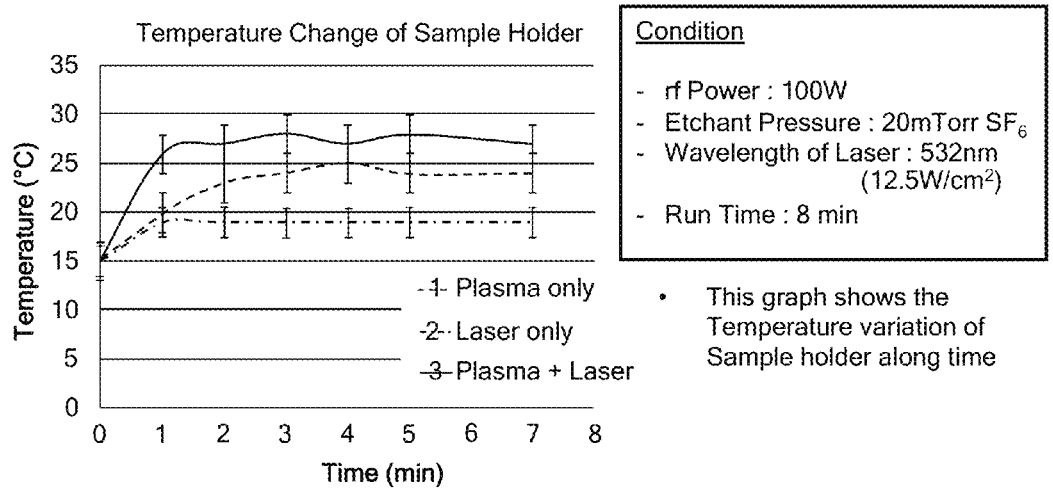
FIG. 6 shows temperature as a function of time for the sample holder during processing.

Referring to FIG. 5, the results showed a temperature effect, and thus the system was upgraded for better temperature control. A flow meter was added to control the flow rate of cooling water to the sample holder from 0.6 GPH to 7 GPH. The temperature variation of the sample holder was measured after the system upgrade, as shown in FIG. 6. Due to more efficient cooling, the temperature becomes stabilized (reaches a plateau region) after a couple of minutes of processing. There is still a slight difference between the "plasma only" and the "plasma+laser" data, but the difference is not believed to be critical. It is beneficial to process a sample when the temperature of the sample holder (and thus the sample) reaches the plateau region.

Figure 7:
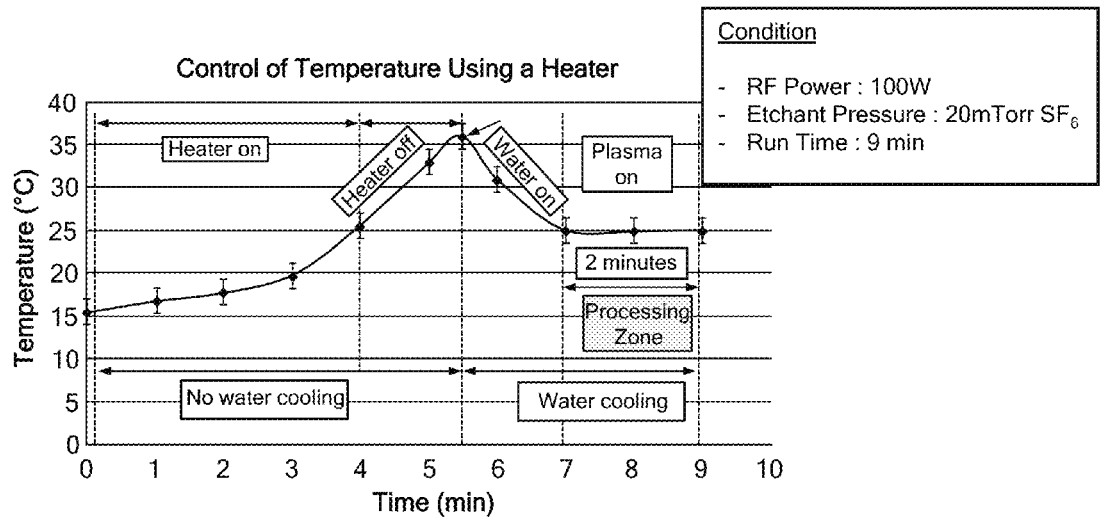
FIG. 7 shows a temperature profile when a heater is used in addition to water cooling to control the temperature of the sample.

As shown by the data of FIG. 7, a heater was also employed to control the temperature of the sample. The sample was heated first without flowing water and then a specific amount of water was flowed using a flow meter to cool it down to a specific temperature. By this means, an attempt was made to minimize the difference between the initial and final temperatures of the sample during processing and to achieve a constant and consistent sample temperature. The resulting improved DEAL system allows for control over both temperature and power density.

Returning now to the description of the etching method, the laser beam used to illuminate the designated portion of the three-dimensional structure may have a wavelength of 1065 nm or less, 532 nm or less, or 266 nm or less. The laser may be an Nd:YAG laser operating at 266 nm, for example. The laser beam may alternatively be an ArF laser operating at a wavelength of 193 nm, in another example.

plasma, a reactive gas such as $SF_6$ or $Cl_2$ is ionized. A gas pressure of between about 50 mTorr and about 150 mTorr may be maintained for etching, particularly when $SF_6$ is employed as the etchant gas.

The plasma may further be pulsed. The pulsing may be carried out at a frequency of at least about 100 Hz, for example, and with a pulse duration of from about 1 ms to

TABLE 1

Exemplary Specifications for a Pulsed Nd:YAG Laser

| | Power Specifications | | | | | | | | | | | | |
|---|---|---|---|---|---|---|---|---|---|---|---|---|---|
| Model[1] | LAB-130- | | | LAB-150- | | | LAB-170- | | | LAB-190-* | | | |
| Rep Rate (Hz) | 10 | 30 | 50 | 10 | 30 | 50 | 10 | 30 | 50 | 10 | 30 | 50 | 100 |
| Energy (mJ/p)[2] | | | | | | | | | | | | | |
| 1064 nm | 450 | 275 | 200 | 650 | 500 | 300 | 850 | 700 | 550 | 1000 | 800 | 600 | 325 |
| 532 nm | 200 | 100 | 70 | 300 | 200 | 100 | 450 | 325 | 210 | 500 | 400 | 250 | 120 |
| 355 nm | 90 | 40 | 30 | 150 | 100 | 40 | 220 | 175 | 100 | 250 | 200 | 100 | 50 |
| EEO-355 | — | — | — | — | — | — | 240 | — | — | 300 | — | — | — |
| 266 nm | 50 | 25 | 15 | 70 | 35 | 25 | 90 | 60 | 30 | 110 | 60 | 25 | 20 |

*About 1 cm diameter beam size.

The laser beam may be operated continuously or it may be pulsed. For example, the laser beam may be pulsed at a frequency of at least about 100 Hz. The pulsing may be carried out for a pulse duration of about 100 ns or less, such as from about 5 ns to about 25 ns (e.g., about 10 ns). Preferably, the laser beam has an energy density of no more than about 0.1 $J/cm^2$ per pulse. For example, the energy density may be between about 5 $mJ/cm^2$ and about 50 $mJ/cm^2$ per pulse. In addition, the laser beam preferably has a power density of no more than about 2.5 $W/cm^2$. At too high of a power density, the laser beam may ablate the structure undergoing etching. For example, the power density may lie between about 0.5 $W/cm^2$ and about 1.5 $W/cm^2$.

Figure 8:
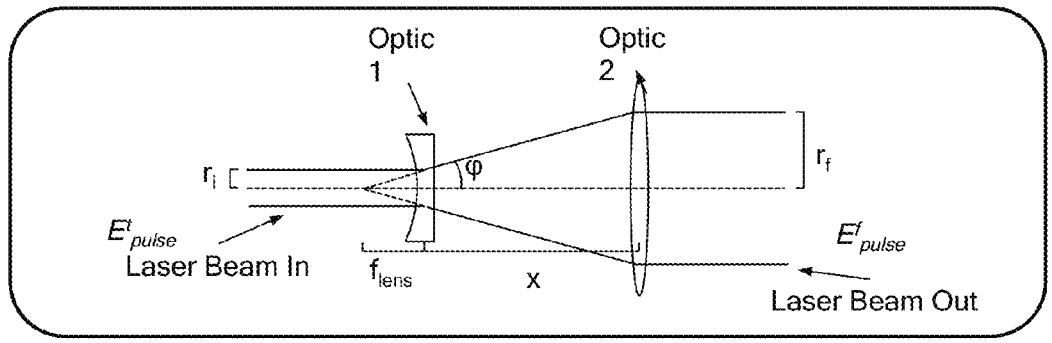
FIG. 8 shows an example of defocusing of a laser beam.

The method may include defocusing the laser beam prior to illuminating the designated portion in order to reduce the power density. The laser beam may be passed through one or more lenses to increase the diameter of the beam and thereby accomplish the defocusing. For example, referring to FIG. 8, the laser beam may be passed through a first lens and a second lens, where the first lens is spaced apart from the second lens by a distance of between about 5 cm and about 90 cm. The diameter of the beam may be increased by about 100% or more. In addition, the same energy density may be created for each wavelength. The input energy for each wavelength may be, in the case of 1064 nm, 325 mJ; in the case of 532 nm, 120 mJ; and in the case of 266 nm, 20 mJ.

Figure 9A:
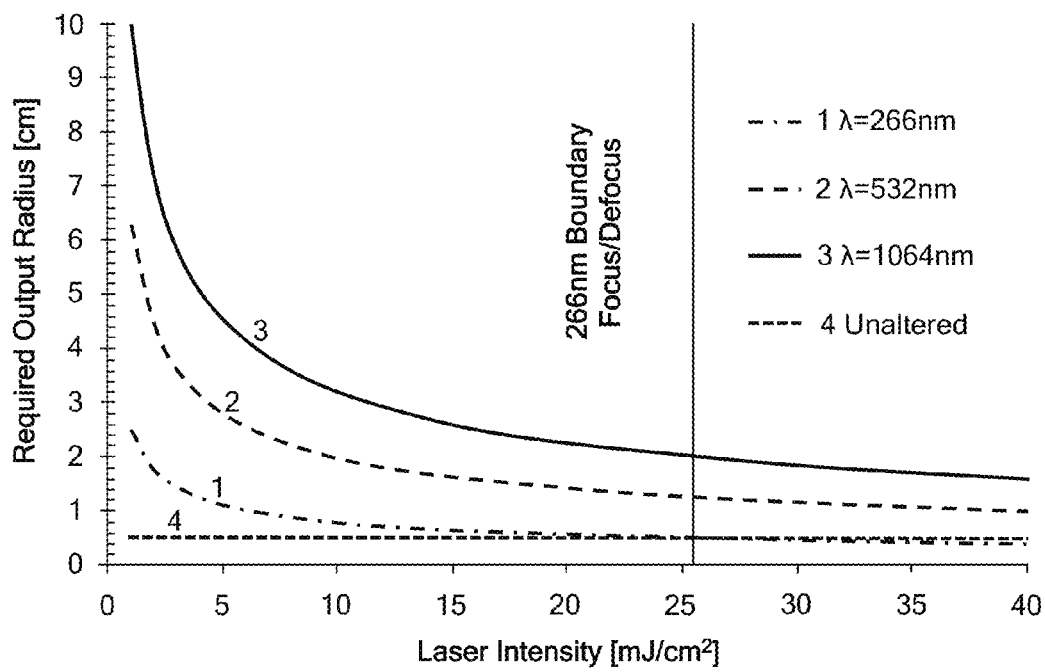
FIG. 9A shows calculated final beam radius as a function of laser intensity for various laser wavelengths.
Figure 9B:
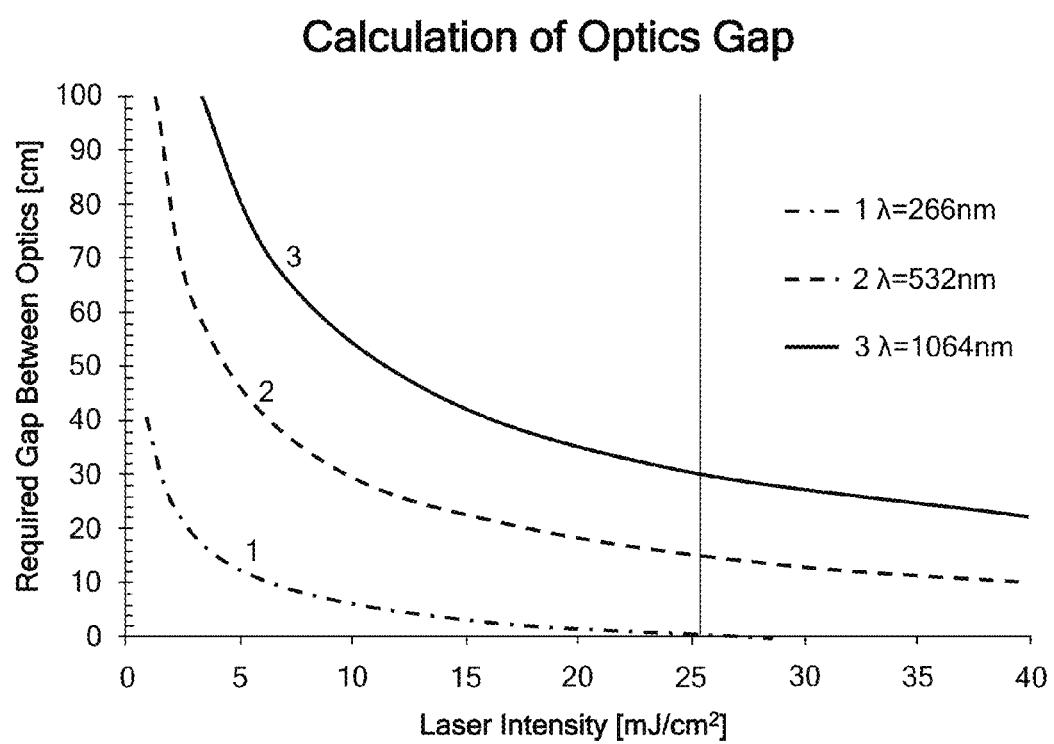
FIG. 9B shows the calculated gap between optics as a function of laser intensity for various laser wavelengths.

FIG. 9A shows the calculated final beam radius required for each laser wavelength to have the same intensity. Having calculated the required beam radius, FIG. 9B shows the gap (length) between optics (lenses) required to achieve the designated intensity. These low power densities are manufacturable since a laser could shine over an entire die or over a whole wafer at once, and the power densities are low enough such that bulk heating is not an issue.

The laser beam may be directed toward the designated portion of the 3-D structure at an acute angle with respect to the designated portion. For example, the laser beam may be nearly parallel with the designated portion.

The plasma is typically produced in an inductively coupled plasma (ICP) system operating at a radiofrequency power of between about 100 W and about 2000 W. To generate the about 10 ms. The etching of the designated and nonilluminated portions of the 3-D structure is generally carried out for a time duration of between about 1 s and about 500 s. For example, the time duration of the etching may be between about 1 s and 100 s, or between about 5 s and about 60 s.

As mentioned above, the system may be configured for temperature control to minimize or eliminate a heating effect of the laser beam. For example, the plasma etching of the designated portion may be carried out at a temperature remaining constant to +/− about 2° C., although larger temperature variations may also be acceptable. In some cases, the temperature may remain constant to +/− about 20° C. during plasma etching. In other cases, it may be desirable to let the temperature rise during processing instead of maintaining it within a particular range. That rise could be as high as a gain of 200° C.

The 3-D structure to be etched may be disposed on a semiconductor substrate. For example, the 3-D structure may be a multi-gate device such as a Fin-FET.

Figure 10:
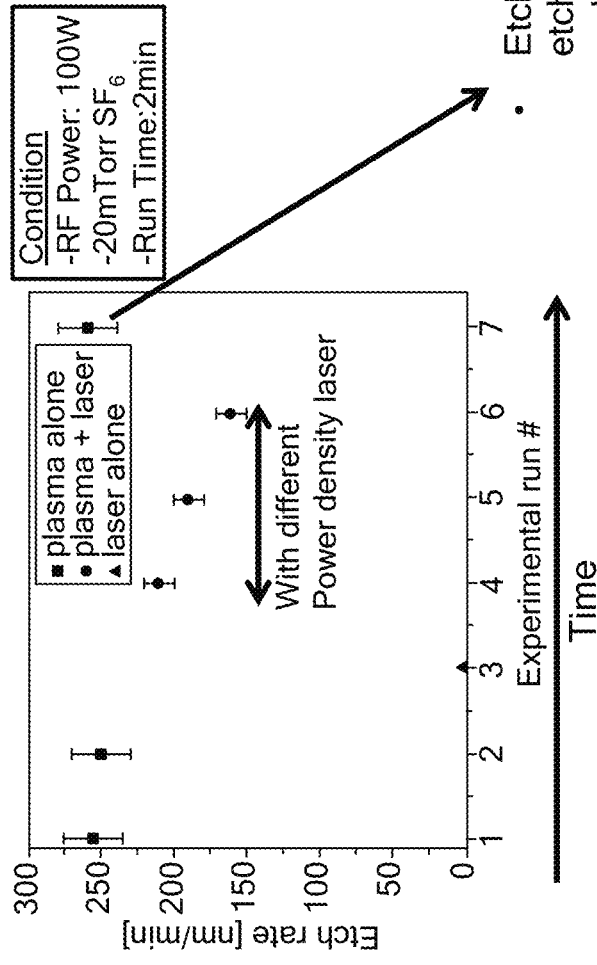
FIG. 10 shows etch rate results for a 266 nm laser wavelength.

FIG. 10 shows results obtained at a 266 nm laser wavelength after the DEAL system was modified to include temperature and power density control. The temperature of the sample holder was maintained between 25° C. and 27° C. As can be seen from the data, the etch rate is lower with laser bombardment. The etch rate is lowest with the plasma+laser at 0.5 $W/cm^2$ power density and increases with increasing laser density; however, it is still lower than with the plasma alone.

Figure 11:
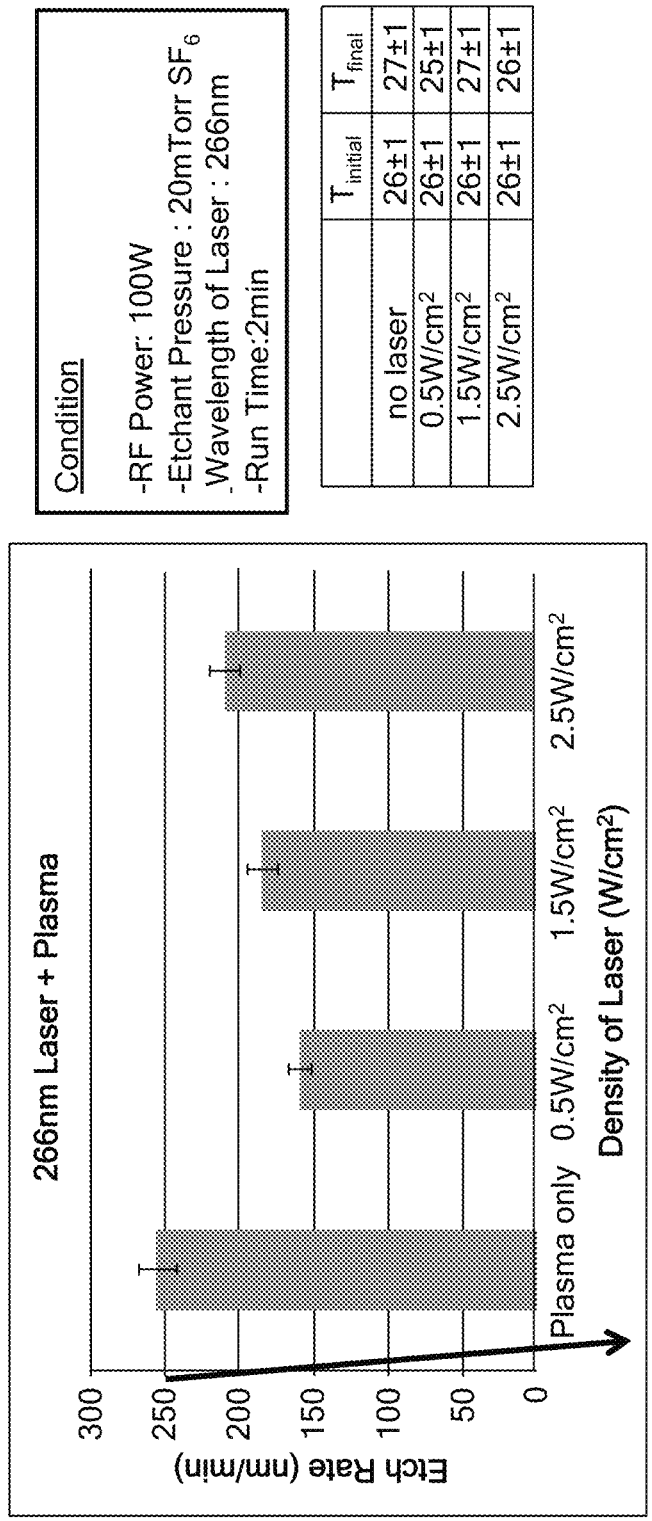
FIG. 11 shows etch rate results for a 266 nm laser wavelength as a function of power density.

FIG. 11 shows the results obtained for the 266 nm laser wavelength as a function of power density. The plasma alone etch rate is reproducible. Lower power density is difficult to achieve with present lenses, but is possible, and is even easier to fit into a commercial process.

Figure 12:
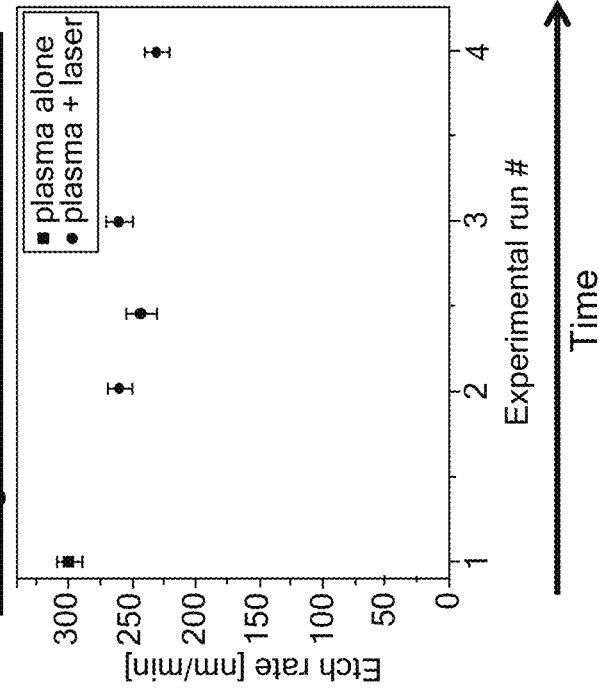
FIG. 12 shows etch rate results for a 532 nm laser wavelength.

FIG. 12 shows results obtained at a 532 nm laser wavelength using the modified DEAL system. The temperature of the sample holder was kept relatively constant during the 2-min etching process. As can be seen from the data, the etch rate decrease with laser bombardment is smaller than in the 266 nm case, even though the energy and power densities are the same. As in the 266 nm case, the etch rate is lowest with the plasma+laser at 0.5 $W/cm^2$ power density.

Figure 13:
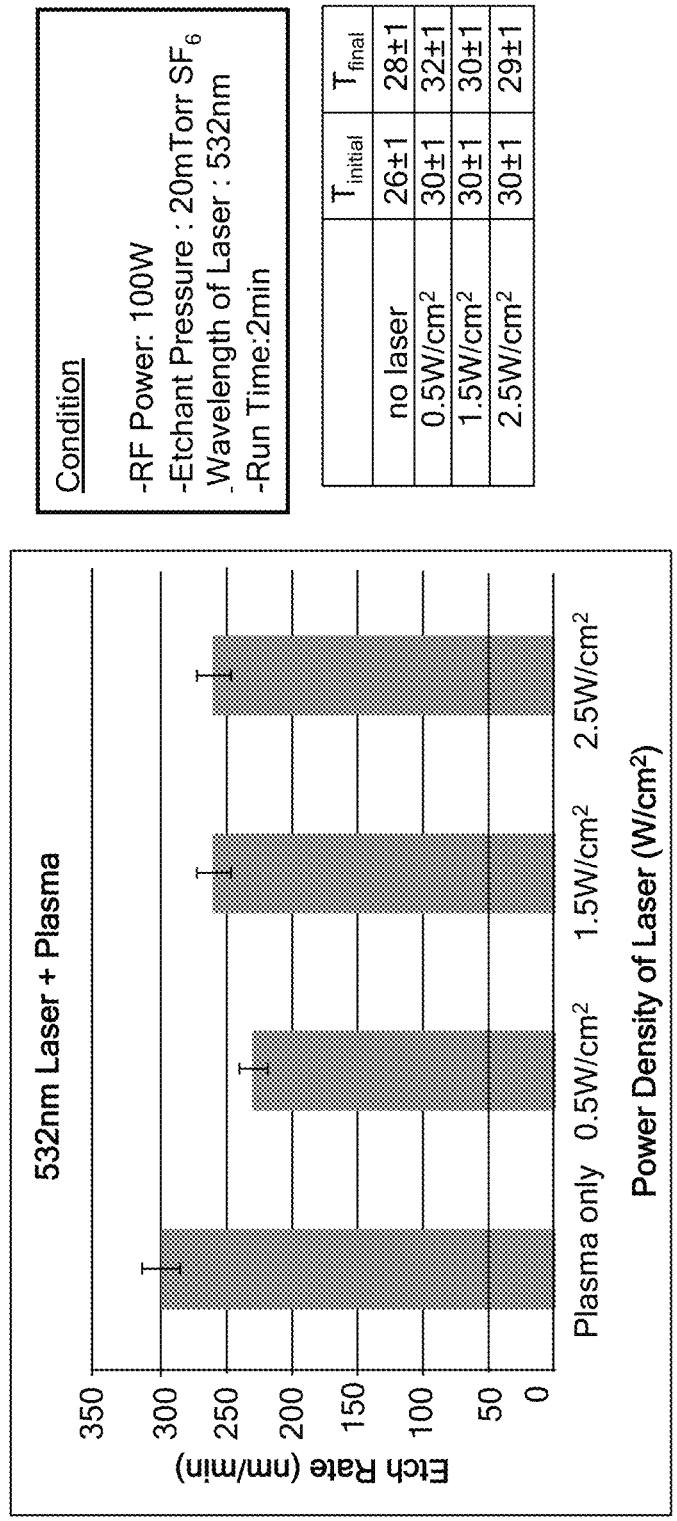
FIG. 13 shows etch rate results for a 532 nm laser wavelength as a function of power density.

FIG. 13 shows the results obtained for the 532 nm laser wavelength as a function of power density. The lower power density gives the most pronounced effect. Energy densities were 5, 15 and 25 mJ/cm$^2$ for 10 ns at 100 Hz.

A third set of data was obtained for a laser wavelength of 1064 nm, as shown in FIG. 14. The processing pressure was changed from 20 mTorr as in the previous two experiments to 60 mTorr. The higher pressure was employed due to flow control problems, and thus the plasma condition is different in this case. A drop in the selectivity of the etching effect is seen and is even more pronounced than in the 532 nm wavelength case.

The inventors theorize that a low selectivity may be due to etching that occurs by the ambient plasma and plasma-sheath potential while the laser is off. Pulsing the plasma may lead to an increase in the etching selectivity between the top and side surface of the sample to be etched. A higher energy laser (e.g., 193 nm, possibly from CYMER) or a faster pulse rate may also be advantageous for increasing selectivity.

FIG. 15 provides estimates of the time required to cover the surface of a specimen to be etched with F radicals generated from an $SF_6$ plasma produced at 100 W rf power and a $SF_6$ pressure of 20 mTorr.

Figure 16:
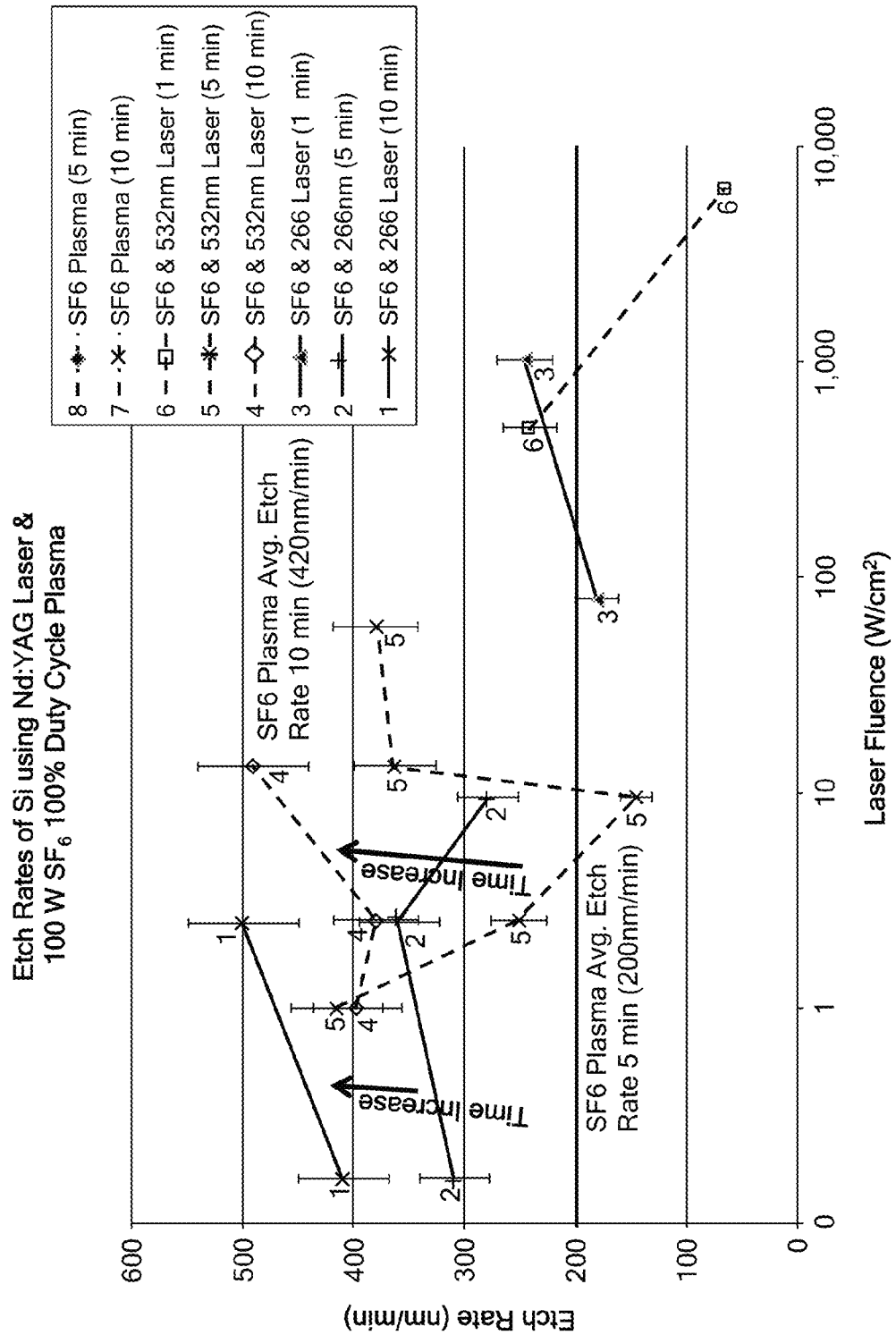
FIG. 16 shows etch rates of Si using a Nd:YAG laser and 100 W $SF_6$ 100% duty cycle plasma.

FIG. 16 reveals the effect of varying etch time, laser wavelength, and laser fluence. The lines marked "4," "5" and "6" correspond to using 532 nm laser light, while the lines marked "1," "2" and "3" correspond to using 266 nm laser light. Using both of these wavelengths, Si was etched in a 100% duty cycle $SF_6$ plasma (meaning that it was continuously on) for periods of 1, 5, and 10 minutes. Very little etching was noted for 1 min exposures with low fluence, thus the reason that the 1 min trial results are only shown above 100 W/cm$^2$. The two horizontal lines that are drawn across the entire plot show the resulting etch rates for the 5 and 10 minute etches without the use of the laser. For these experiments, water cooling was employed to prevent temperature changes greater than 30° C. from occurring due to plasma and laser radiation exposure. This is utilized to try to rule out any variance in etch rate due to temperature changes.

The results reveal that using the laser can have the effect of lowering etch rate as well as increasing etch rate. For the 266 nm exposure, it is observed that for the 1 minute trials, using 79 W/cm$^2$ laser radiation, the etch rate is 180 nm/min. Increasing the fluence to 1000 W/cm$^2$ increased the etch rate is 250 nm/min. Laser radiation, in these cases, observably promoted etching of Si; without laser exposure, there was no observable etching using $SF_6$ plasma alone. For the 1 min exposure using 532 nm, increasing the 532 nm laser fluence from 500 W/cm$^2$ to 6400 W/cm$^2$ decreased the laser assisted etch rate from 240 nm/min down to 60 nm/min. Clearly, for the 266 nm exposure case, the increased fluence helped to increase etching, whereas the increase in the 532 nm fluence began to inhibit the idealized etch rate.

In the 5 min exposures, it is observed that for 266 nm laser radiation, etching is increased. For the 532 nm exposure, however, there is an initial decrease in etching of 400 nm/min to 150 nm/min, using 1 to 10 W/cm$^2$, which results in an etch rate that is reduced from the $SF_6$ plasma only case. Increasing laser fluence beyond 10 W/cm$^2$ appears to cause an increase in Si etch rate beyond the baseline case of plasma only.

The 10 min exposures produce interesting results. It should be noted that etch rate is not necessarily linear with time of exposure (as clearly observed by the differences in etch rates observed for the various experimental exposure periods). Such variations are caused by temperature increases and various other surface physics that change with increased etching. The results that are observed are consequently unique from the 5 min and 1 min exposure cases. As can be seen, using 266 nm radiation, etching is inhibited, from a baseline of 420 nm/min down to 410 nm/min, using a fluence of 0.16 W/cm$^2$. Increasing the fluence to 2.5 W/cm$^2$ increases the etch rate up to 500 nm/min, thus increasing the etch rate over the baseline value. Similar results are observed using the 532 nm radiation. For the 1 and 2.5 W/cm$^2$ fluences, laser radiation serves to reduce etch rate. At 13 W/cm$^2$, however, etching is promoted with the use of the laser.

These results indicate that the etching rate of Si using a reactive plasma may be either increased or inhibited using laser radiation with the proper fluence. Such results can be utilized in industry to adjust the variable etch rate of a particular feature.

Figure 17:
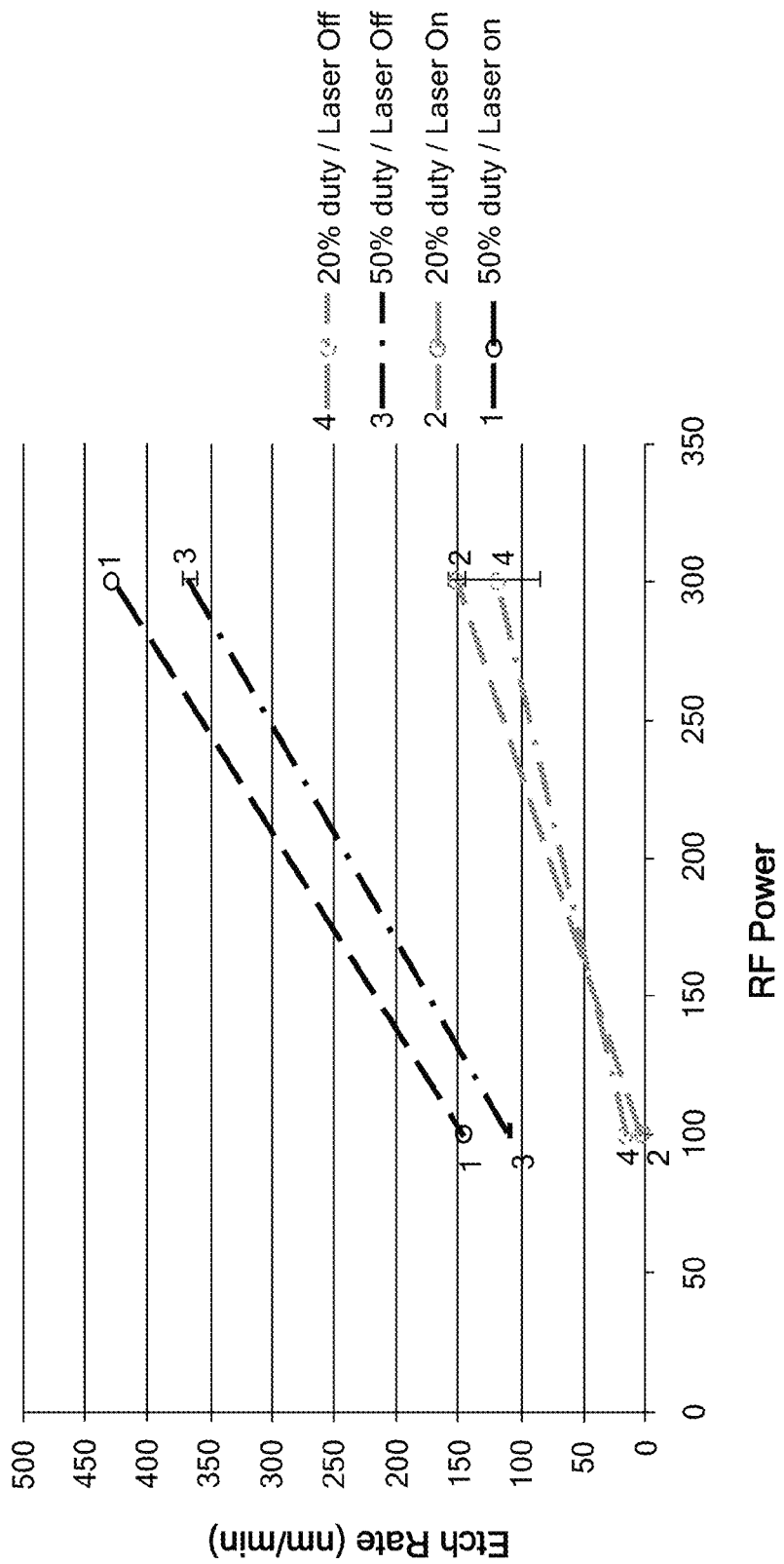
FIG. 17 shows etch rates of Si using 16 W/cm² of 532 nm light and a variable duty cycle $SF_6$ plasma.

The second set of results, shown in FIG. 17, explores the use of the amount of time the $SF_6$ plasma is left on. For these experiments, the RF power supply was synchronized to the laser pulse (since the operating frequency of the laser cannot be changed) at 100 Hz. Based on timing, which was not adjustable, the laser pulse was present in the middle of the 20% duty cycle plasma pulse. Duty cycle, in this case, means the percentage of time in 1/100th of a second that the plasma was ignited. This equates to approximately a 2 ms and a 5 ms plasma cycle for the 20% and 50% duty cycles respectively. For this experiment, the 532 nm light was utilized as the laser radiation with a fluence of 10 W/cm$^2$. The effect of RF power was also explored for both the 100 W and 300 W cases. The exposures were performed for 10 min duration. These results were taken to be comparable to the previously observed case where etch rate was most subdued with the use of laser radiation.

In both experiments, it is observed that laser radiation has the effect of increasing the $SF_6$ plasma etch rate above the baseline case. This is in contradiction to the results revealed in FIG. 16 and may have to do with the time separation between the two experiments. It is possible that the environment of the lab during this experiment could affect the resulting etch rates. Nevertheless, it is clear from these data that increasing RF power increases the etch rate (as expected) nearly linearly, while increasing the duty cycle has a slight effect on the etch rate that is not linear (otherwise the two plots would be parallel instead of the 50% etch rate line having a higher slope). It also appears that using the 50% duty cycle results in a larger quantitative increase in etch rate from the baseline case. This is especially clear in contrast to the 100 W 20% duty sample that shows practically no effect on etch rate with the incorporation of the laser.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method of selectively etching a three-dimensional structure, the method comprising:

initiating generation of a plasma in contact with a three-dimensional structure;

illuminating a designated portion of the three-dimensional structure with a pulsed laser beam while the plasma is being generated, the laser beam having an energy density of no more than about 100 mJ/cm$^2$ per pulse;

plasma etching nonilluminated portions of the three-dimensional structure at a first etch rate; and plasma etching the designated portion of the three-dimensional structure at a second etch rate, the second etch rate being different from the first etch rate, wherein the three-dimensional structure is provided on a substrate prior to initiating the generation of the plasma.

2. The method of claim 1 wherein the second etch rate is higher than the first etch rate.

3. The method of claim 1 wherein the second etch rate is lower than the first etch rate.

4. The method of claim 3 wherein the second etch rate is at least about 30% lower than the first etch rate.

5. The method of claim 1 wherein the laser beam undergoes pulsing at a frequency of at least about 100 Hz.

6. The method of claim 5 wherein the pulsing is carried out for a pulse duration of about 100 ns or less.

7. The method of claim 1 wherein the laser beam comprises a power density of no more than about 2.5 W/cm$^2$.

8. The method of claim 1 wherein the illuminating comprises desorbing active radicals from the designated portion.

9. The method of claim 1 wherein the illuminating comprises directing the laser beam toward the designated portion at an acute angle with respect to the designated portion.

10. The method of claim 1 further comprising defocusing the laser beam prior to illuminating the designated portion of the three-dimensional structure.

11. The method of claim 10 wherein defocusing the laser beam comprises increasing the diameter of the beam by at least about 100%.

12. The method of claim 10 wherein defocusing the laser beam comprises passing the laser beam through one or more lenses.

13. The method of claim 1 wherein the plasma is generated at a gas pressure of between about 50 mTorr and about 150 mTorr.

14. The method of claim 1 wherein generating the plasma includes pulsing the plasma at a frequency of at least about 100 Hz.

15. The method of claim 14 wherein the pulsing is carried out with a pulse duration of about 1 ms to about 10 ms.

16. The method of claim 1 wherein the plasma etching of the designated portion is carried out at a temperature remaining constant to +/− about 2° C.

17. The method of claim 1 wherein the etching of the designated and nonilluminated portions is carried out for a time duration of between about 1 s and about 500 s.

18. The method of claim 1 wherein the three-dimensional structure comprises a multigate transistor.

19. The method of claim 18, wherein the multigate transistor comprises a Fin-FET.

* * * * *